(12) United States Patent
Zeller et al.

(10) Patent No.: US 12,204,008 B2
(45) Date of Patent: Jan. 21, 2025

(54) METHOD FOR CAPTURING MR DATA

(71) Applicant: Siemens Healthcare GmbH, Erlangen (DE)

(72) Inventors: Mario Zeller, Erlangen (DE); Dominik Paul, Bubenreuth (DE)

(73) Assignee: Siemens Healthineers AG, Forchheim (DE)

( * ) Notice: Subject to any disclaimer, the term of this patent is extended or adjusted under 35 U.S.C. 154(b) by 0 days.

(21) Appl. No.: 17/544,930

(22) Filed: Dec. 7, 2021

(65) Prior Publication Data

US 2022/0179029 A1 Jun. 9, 2022

(30) Foreign Application Priority Data

Dec. 8, 2020 (DE) ...................... 10 2020 215 490.2

(51) Int. Cl.
*G01V 3/00* (2006.01)
*G01R 33/48* (2006.01)
(Continued)

(52) U.S. Cl.
CPC ...... *G01R 33/5611* (2013.01); *G01R 33/4824* (2013.01); *G01R 33/4835* (2013.01); *G01R 33/543* (2013.01)

(58) Field of Classification Search
CPC .............. G01R 33/3415; G01R 33/543; G01R 33/5659; G01R 33/36; A61B 5/055
(Continued)

(56) References Cited

U.S. PATENT DOCUMENTS

2013/0278263 A1 10/2013 Feng
2016/0025833 A1* 1/2016 Polimeni ............ G01R 33/5611
324/309
(Continued)

FOREIGN PATENT DOCUMENTS

CN 104781685 B * 12/2017 ......... G01R 33/5611
CN 109239631 A * 1/2019 ......... G01R 33/4822
(Continued)

OTHER PUBLICATIONS

KR 20140118852 A (Fautz) (Year: 2014).*

*Primary Examiner* — Walter L Lindsay, Jr.
*Assistant Examiner* — Frederick Wenderoth
(74) *Attorney, Agent, or Firm* — Lempia Summerfield Katz LLC

(57) ABSTRACT

According to a method, first MR reference data and first MR imaging data are captured. Further MR imaging data is then captured. The capturing includes in each case generating at least one excitation pulse with a transmit coil of the magnetic resonance apparatus and irradiating the at least one excitation pulse into a patient receiving region, generating MR signals in a generation region using the at least one excitation pulse, and receiving the MR signals as MR data with a receive coil. A degree of difference that describes a difference between the generation region on capture of the first MR reference data and the generation region on capture of the further MR imaging data is determined. MR reference data is provided as a function of the degree of difference. An MR image is reconstructed based on the captured further MR imaging data and the provided further MR reference data.

23 Claims, 4 Drawing Sheets

(51) Int. Cl.
*G01R 33/483* (2006.01)
*G01R 33/54* (2006.01)
*G01R 33/561* (2006.01)

(58) Field of Classification Search
USPC .......................................................... 324/309
See application file for complete search history.

(56) References Cited

U.S. PATENT DOCUMENTS

2018/0017655 A1*  1/2018  Zeller ................. G01R 33/4835
2018/0085012 A1*  3/2018  Wei ..................... A61B 5/02125
2018/0217219 A1   8/2018  Beck et al.
2019/0250236 A1   8/2019  Paul et al.
2019/0277932 A1*  9/2019  Zeller ................. G01R 33/5602

FOREIGN PATENT DOCUMENTS

DE      102018202137 A1    8/2019
EP          2624170 A2 *   8/2013   ............... G06K 9/00

* cited by examiner

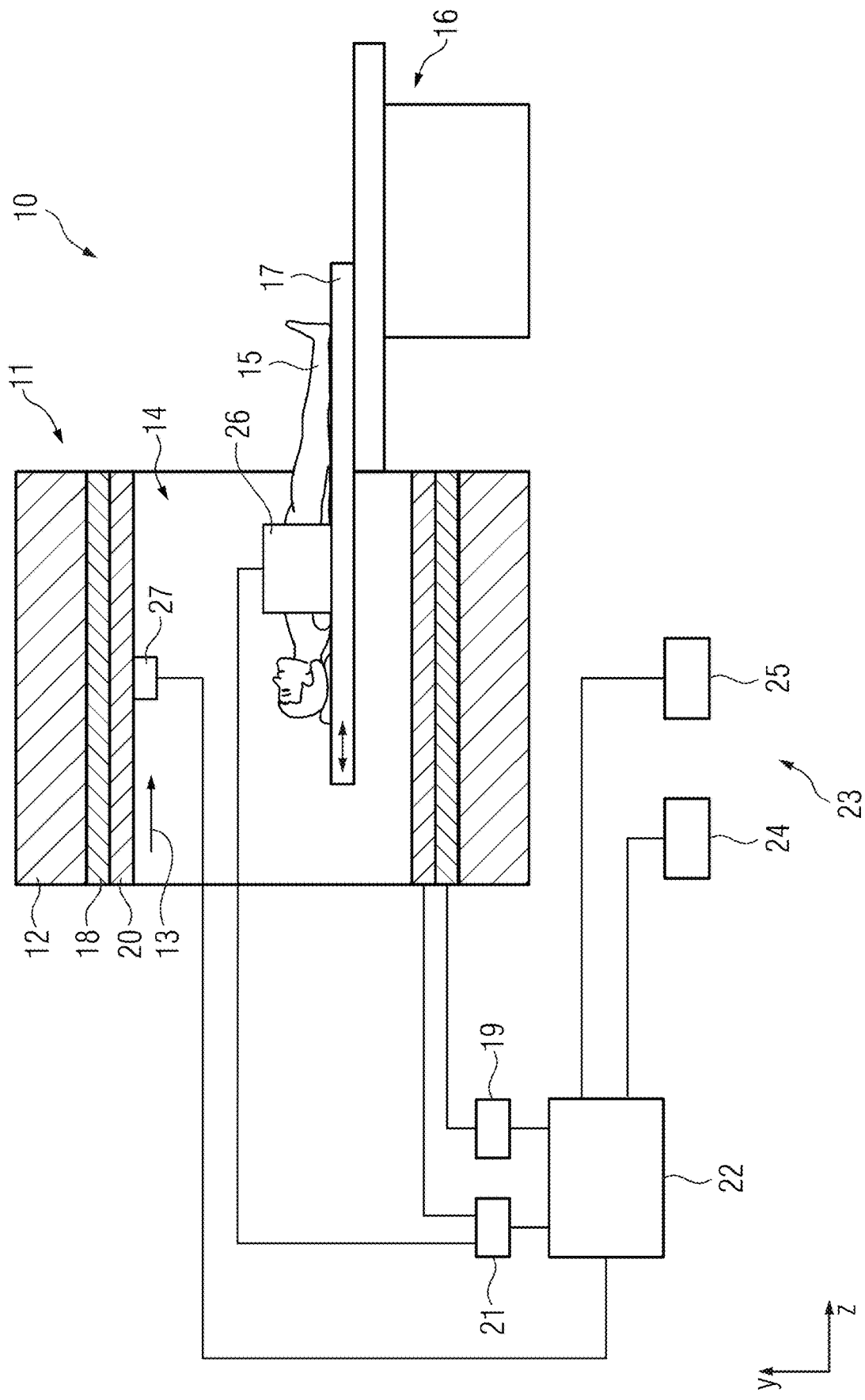

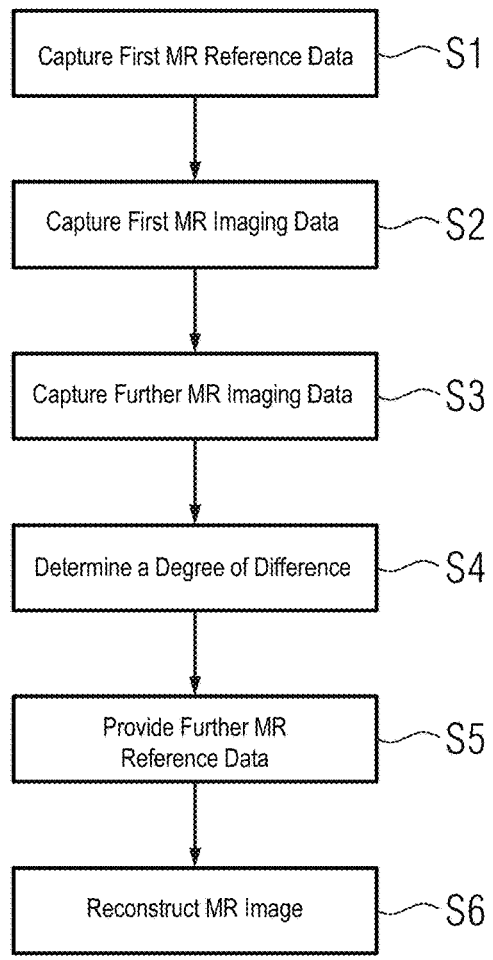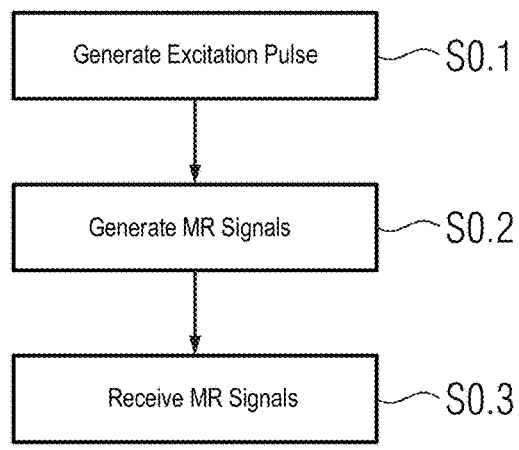

METHOD FOR CAPTURING MR DATA

This application claims the benefit of German Patent Application No. DE 10 2020 215 490.2, filed on Dec. 8, 2020, which is hereby incorporated by reference in its entirety.

BACKGROUND

The present embodiments relate to methods for capturing MR data, to a magnetic resonance apparatus, and to a computer program product.

In medical technology, imaging by magnetic resonance (MR) (e.g., magnetic resonance tomography (MRT) or Magnetic Resonance Imaging (MRI)) is distinguished by high soft tissue contrast. Such imaging involves using a magnetic resonance apparatus to irradiate a human or animal patient with excitation pulses. This triggers MR signals in the patient. The MR signals are received as MR data (e.g., MR measurement data) from the magnetic resonance apparatus and used to reconstruct MR images.

Parallel imaging techniques such as, for example, GeneRalized Autocalibrating Partially Parallel Acquisition (GRAPPA), SENSitivity Encoding (SENSE), or slice-GRAPPA have in recent years led to an acceleration in MR imaging. The basic concept behind these technologies is to achieve a reduction in measurement time by reducing the captured k-space lines using Nyquist undersampling (e.g., for GRAPPA and SENSE) or by simultaneous capture of a plurality of slices in one image (e.g., in slice-GRAPPA). Resultant aliasing may be corrected in a reconstruction step by capturing MR signals with multichannel coils, in which individual coil elements cover different ranges of the field of view (FOV) (e.g., whereby the sensitivities of the coil elements vary). MR reference data with full Nyquist sampling is conventionally required for determining the sensitivities. This is obtained, depending on the imaging sequence and parallel imaging technique, either by full sampling of the center of the k-space (e.g., in the case of GRAPPA) or by a separate reference capture, which precedes the actual imaging measurement.

SUMMARY AND DESCRIPTION

The scope of the present invention is defined solely by the appended claims and is not affected to any degree by the statements within this summary.

The present embodiments may obviate one or more of the drawbacks or limitations in the related art. For example, a capture time in the case of application of parallel imaging techniques is reduced.

According thereto, a method for capturing MR data (e.g., medical MR data) using a magnetic resonance apparatus is provided. In this method, first MR reference data and first MR imaging data are captured. Once the first MR imaging data has been captured, further MR imaging data is captured. Capture of the MR data (e.g., of the first MR reference data), the first MR imaging data, and the further MR imaging data in each case involves, in each case, generating at least one excitation pulse with a transmit coil of the magnetic resonance apparatus and irradiating the at least one excitation pulse into a patient receiving region of the magnetic resonance apparatus, generating MR signals in a generation region (e.g., a spatial generation region) within the patient receiving region using the at least one excitation pulse, and receiving the MR signals as MR data with a receive coil of the magnetic resonance apparatus.

In addition, a degree of difference is determined. The degree of difference describes a difference between the generation region on capture of the first MR reference data and the generation region on capture of the further MR imaging data. Further MR reference data is provided as a function of the degree of difference. At least one MR image is reconstructed based on the captured further MR imaging data and the provided further MR reference data.

According to the prior art, in each case, associated MR reference data is captured prior to each capture of MR imaging data and provided for reconstruction of the MR imaging data.

According to the present embodiments, the MR reference data, which is provided for reconstruction of the MR image, is not as a whole recaptured anew for each part of the MR imaging data to be captured, but rather provision proceeds as a function of the degree of difference, which describes a difference between the generation regions. In one embodiment, prior to capture of MR imaging data, it is determined whether the image content to be captured or the generation region is substantially unchanged compared to capture of the current valid MR reference data. Depending on the result, the current valid MR reference data may be reused or rerecorded. In this way, unnecessary repeated capture of MR reference data may, for example, be avoided, and instead, already captured MR reference data may again be provided and/or used to reconstruct the at least one MR image. Negative impacts on the quality of the at least one MR image resulting from significant patient movement (e.g., between two measurements) may, for example, be minimized.

The MR reference data may, for example, include calibration data. The MR reference data may take the form of a data set (e.g., a calibration data set). The MR imaging data may, for example, include raw data. The MR imaging data may take the form of a data set (e.g., a raw data set).

MR reference data may be suitable for determining coil sensitivities. Coil sensitivity conventionally describes the receive characteristic of the receive coil. The strength of the received MR signal of a voxel is conventionally dependent on the voxel location relative to the receive coil. In general, the signal is highest in the vicinity of the coil. The signal conventionally becomes weaker the further the voxel is from the receive coil.

The MR data (e.g., the MR reference data and/or the MR imaging data) may be captured according to a parallel imaging technique, such as, for example, GRAPPA, SENSE or slice-GRAPPA. For example, capture of the first MR reference data involves capture of a GRAPPA kernel. The MR reference data may be suitable as the basis for determining sensitivities of coil elements of the receive coil. The MR reference data may sample the k-space completely (e.g., the MR reference data fulfills the Nyquist-Shannon sampling theorem). The MR imaging data may not sample the k-space completely (e.g., the MR imaging data does not fulfill the Nyquist-Shannon sampling theorem). Such undersampling may bring about an overall acceleration of the capture of MR data. MR data may be all MR reference data and MR imaging data.

Capture of the MR imaging data may be subdivided into at least two subportions, the first MR imaging data and the second MR imaging data. In one embodiment, a different region of the patient is measured with the first MR imaging data than with the second MR imaging data. For example, a first slice is measured using the first MR imaging data, and a second slice is measured using the second MR imaging data.

A generation region is, for example, a signal-generating region. A generation region may be a spatial region (e.g., a volume or a surface), in which the MR signals are generated based on magnetic resonance. The MR signals generated may be irradiated from the generation region into the receive coil, in which the MR signals may be received as MR data. In other words, the MR signals stem from the generation region (e.g., the MR signals originate or arise there).

For example, the generation region of the MR signal coincides with the spatial region in the patient receiving region of the magnetic resonance apparatus in which a patient is located. The patient, for example, includes a number of water molecules, the protons of which (e.g., the spins thereof) may be excited by the at least one excitation pulse, which may lead to magnetic resonance. A change in the generation region may thus be caused, for example, by movement of the patient, since the spatial region in which magnetic resonance may arise may thereby be changed.

The generation region for capture of the first MR reference data is, for example, the generation region before (e.g., directly before) and/or after (e.g., directly after) and/or during capture of the first MR reference data. The generation region for capture of the further MR imaging data may be the generation region before (e.g., directly before) and/or after (e.g., directly after) and/or during capture of the further MR imaging data.

A further embodiment of the method provides for new MR reference data to be captured and for the new MR reference data to be provided as the further MR reference data. This is the case, for example, if the degree of difference exceeds a first threshold value. Capture of new MR reference data and the provision thereof as the further MR reference data may provide that, for example, the quality of the newly captured MR reference data is sufficiently good for the at least one MR image to be reconstructed with sufficiently high quality.

A further embodiment of the method provides for the first MR reference data to be modified and for the modified MR reference data to be provided as the further MR reference data. This is the case, for example, if the degree of difference exceeds a second threshold value. In one embodiment, capture of new MR reference data is not necessary if the generation region has changed only to a certain extent between capture of the first MR reference data and the start of capture of the further MR imaging data. Modification of the first MR reference data and the provision thereof as the further MR reference data may provide that, for example, the quality of the modified first MR reference data is sufficiently good for the at least one MR image to be reconstructed with sufficiently high quality.

A further embodiment of the method provides that the first MR reference data is provided as the further MR reference data (e.g., unchanged). This is the case, for example, if the degree of difference falls below a third threshold value. In one embodiment, capture of new MR reference data and/or modification of the first MR reference data (e.g., current) is not necessary if the generation region has not changed or has changed only a little between capture of the first MR reference data and the start of capture of the further MR imaging data. Then, for example, the quality of the first MR reference data (e.g., current) may be sufficient for the at least one MR image to be reconstructed therewith to a sufficiently high quality.

A further embodiment of the method provides for first spatial data of the generation region to be captured on capture of the first MR reference data (e.g., directly before and/or directly after and/or during capture of the first MR reference data), for further location data to be captured on capture of the further MR imaging data (e.g., directly before and/or directly after and/or during capture of the further MR imaging data), and for the degree of difference to be determined based on the first location data and the further location data.

Location data may be data that describes the spatial location of the generation region. The location data, for example, describes a volume and/or a surface comprising the generation region. The location data, for example, includes two- and/or three-dimensional coordinates. The degree of difference may be particularly simply determined from the location data. For example, the overlap of the volumes and/or surfaces occupied by the generation region on capture of the first MR reference data and on capture of the further MR imaging data is determined. The degree of difference may be small if the overlap is great and vice versa.

A further embodiment of the method provides for capture of the first location data and/or of the further location data to include the capture of MR data using the magnetic resonance apparatus.

In this case, the first location data and/or the further location data may, for example, include the capture of MR navigator data using the magnetic resonance apparatus. The data is captured, for example, using a 3-shot navigator sequence. A navigator sequence, for example, includes one or more spin or gradient echoes (e.g., additional spin or gradient echoes) for detecting patient position changes in the patient receiving region.

The location data (e.g., 3-shot navigator data) may, for example, be captured in the context of sequence adjustment. In this case, projection of the patient in three spatial directions may, for example, be acquired by three captures of the k-space center in three spatial directions, respectively (e.g., orthogonal spatial directions). The location data (e.g., the 3-shot navigator data) may, for example, be captured both after capture of the first MR reference data and before each subsequent capture of MR data (e.g., of MR imaging data).

In one embodiment, the navigator data (e.g., the 3-shot navigator data) is used to provide the further MR reference data. For example, the navigator data (e.g., parts of the navigator data) is combined with captured new MR reference data to, for example, save on measurement time. In one embodiment, the navigator data (e.g., parts of the navigator data) may be averaged with captured new MR reference data in order to improve the result.

A further embodiment of the method provides for capture of the first location data and/or of the further location data to include the capture of optical signals, radar signals, and/or reflected radiofrequency (RF) signals, and/or pilot tone signals.

The optical signals may, for example, be captured with a camera (e.g., a 3D camera). The radar signals may, for example, be captured with a radar measuring device.

The reflected RF signals may, for example, be captured with an RF antenna. The reflected RF signals may, for example, be signals that are generated by a transmit antenna of the magnetic resonance apparatus (e.g., to generate magnetic resonance signals) and reflected by the patient (e.g., without magnetic resonance occurring in the process).

The pilot tone signals may, for example, be captured by an RF antenna that is also configured to capture magnetic resonance signals. For example, a pilot tone transmitter generates a signal with a frequency non-identical to a Larmor frequency of the magnetic resonance apparatus, where this signal interacts with the patient, and then, the resultant pilot tone signals are captured by an RF antenna.

The RF antenna may, for example, also be configured to receive magnetic resonance signals.

A further embodiment of the method provides for the degree of difference to be determined based on a histogram comparison of the first location data and the further location data, and/or an item of mutual information of the first location data and the further location data. In one embodiment, a change in the position of the patient may thereby be detected.

A further embodiment of the method provides for an MR image (e.g., at least one further MR image) to be reconstructed based on the first reference data and the further MR imaging data. Determination of the difference dimension proceeds based on the MR image (e.g., based on the at least one further MR image). The MR image may be analyzed to determine the degree of difference (e.g., with the assistance of a neural network).

For example, an MR image may be reconstructed based on the first reference data and the first MR imaging data. The MR image is compared with the MR image reconstructed based on the first reference data and the further MR imaging data.

A further embodiment of the method provides that it is verified whether the difference between the generation region on capture of the first MR reference data and the generation region on capture of the further MR imaging data is caused wholly or in part by translation of the generation regions in a plane defined by a read-out direction and a phase-encoding direction; in the affirmative, a linear phase ramp in the respective k-space-direction is multiplied, according to the Fourier shift theorem and corresponding to the translation, onto the first MR reference data, which is provided as further MR reference data.

A further embodiment of the method provides for capture of the MR data to include the capture of a plurality of slices along a slice direction. A part of the first MR reference data is assigned to at least a part of the plurality of slices.

For example, in this case, it is verified whether the difference between the generation region on capture of the first MR reference data and the generation region on capture of the further MR imaging data is caused wholly or in part by a translation of the generation regions along a slice direction; in the affirmative, the first MR reference data is modified for at least one slice, and the modified MR reference data is provided as the further MR reference data. Modification of the first MR reference data includes a change in the assignment of at least one part of the first MR reference data and/or an interpolation of at least two parts of the MR reference data assigned to at least two different slices.

The slice direction is, for example, a direction in which a sequence of slices to be captured is arranged. The slice direction may correspond to a frequency encoding direction. If the generation region undergoes translation along the slice direction, the calibrated GRAPPA kernel may be reassigned to another slice, depending, for example, on the scope of the first MR reference data. If the endpoint of the translation lies between two slices, the respective slice kernel may be interpolated to yield a new kernel. The edge slices may optionally be recalibrated. For example, capture of new MR reference data may be limited to data that is not contained in the first MR reference data.

A further embodiment of the method provides that it is verified whether the difference between the generation region on capture of the first MR reference data and the generation region on capture of the further MR imaging data is caused wholly or in part by rotation of the generation regions; in the affirmative, for at least one slice, the first MR reference data is modified as a function of the rotation, and the modified MR reference data is provided as the further MR reference data. The modification of the first MR reference data includes interpolation of the first MR reference data.

A further embodiment of the method provides for the provided further MR reference data to be adopted as first MR reference data for MR imaging data that is captured after the further MR imaging data. If not only first MR imaging data and further MR imaging data, but rather yet further MR imaging data is to be captured, the technical teaching described herein may also be applied mutatis mutandis to this additional MR imaging data.

The method may be applied, in the case of capture of MR data that includes a plurality of capture fragments (e.g., sequence fragments), to all capture fragments. In this case, access may be repeatedly made, for each capture fragment, to already previously provided further MR reference data, which subsequently serves as first MR reference data (e.g., as the basis from which new further MR reference data may again be derived).

A further embodiment of the method provides for verification of whether the degree of difference exceeds a specified threshold value; in the affirmative, new MR reference data is captured, and the new MR reference data is provided as the further MR reference data. The predetermined threshold value may be set such that only if this threshold value is exceeded is the quality of the at least one reconstructed MR image no longer sufficient.

It may thereby be achieved that new MR reference data is captured only when really necessary. Capture of the MR data may thereby be accelerated overall.

A further embodiment of the method provides that, during capture of the first MR imaging data, a change in the generation region is detected. New MR reference data is captured, and the new MR reference data provided as further MR reference data. A point in time is determined at which the change in the generation region exceeds a specified limit value. In this case, different MR reference data is assigned to the part of the first MR imaging data captured before this point in time than to the part of the first MR imaging data captured after this point in time.

This makes it possible to provide that, for example, in the event of movement of the patient during capture of first MR imaging data, the part of the first MR imaging data captured before or after the movement is in each case reconstructed based on MR reference data that best describes the state of the patient before or after the movement. Any artifacts in the resultant MR images may thus be reduced.

A further embodiment of the method provides that, in the event of continuous change in the generation region, caused, for example, by movement of the patient, MR reference data adapted to the degree of this change and, for example, averaged and/or interpolated from the first MR reference data and the new MR reference data is assigned to the first MR imaging data. This too may lead to a reduction in any artifacts in the resultant MR images.

For example, the first MR reference data and the new MR reference data may be averaged on an equally weighted basis for a movement state if the movement state describes a middle position between a movement state prior to movement and a movement state after movement.

Further, a magnetic resonance apparatus that is configured to perform one of the above-described methods for capturing MR data is provided.

The magnetic resonance apparatus, for example, includes a unit for capturing MR data (e.g., a magnet unit with a main magnet for generating a main magnetic field, a gradient coil unit for generating magnetic field gradients, a radiofrequency antenna unit with a transmit coil for generating excitation pulses, and a receive coil for receiving MR signals). Generation of the excitation pulses and reception of the MR signals may also proceed using the same coil (e.g., using a transceive coil).

The magnetic resonance apparatus further includes, for example, a system control unit with one or more processors and electronic memories. The system control unit is configured to perform computing operations, such as, for example, determination of a degree of difference that describes a difference between the generation region on capture of the first MR reference data and the generation region on capture of the further MR imaging data. The system control unit is further configured for provision of further MR reference data as a function of the degree of difference and/or reconstruction of at least one MR image based on the captured further MR imaging data and the provided further MR reference data.

The advantages of the magnetic resonance apparatus correspond substantially to the advantages of the methods for capturing MR data using a magnetic resonance apparatus, which have been described in detail above. Features, advantages, or alternative embodiments mentioned in this connection are likewise also applicable to the other claimed subjects and vice versa.

Further, a computer program product is provided. The computer program product includes a program (e.g., having instructions) and is directly loadable into a memory of a programmable system control unit of a magnetic resonance apparatus and has program means (e.g., libraries and auxiliary functions) for performing a method according to the present embodiments when the computer program product is executed in the system control unit of the magnetic resonance apparatus. The computer program product may, in this respect, include software with source code that has yet to be compiled and linked or is merely to be interpreted, or executable software code that is merely to be loaded into the system control unit for execution.

The computer program product may execute method acts according to the present embodiments for capturing MR data rapidly, identically, repeatably, and robustly. The computer program product is configured such that the computer program product may carry out the method acts according to the present embodiments by the system control unit. The system control unit may, in each case, include the prerequisites such as, for example, an appropriate working memory, an appropriate graphics card, or an appropriate logic unit for it to be possible to carry out the respective method steps efficiently.

The computer program product is, for example, stored on a computer-readable medium (e.g., a non-transitory computer-readable storage medium) or saved to a network or server, where the computer program product may be loaded into the processor of a local system control unit that may be directly connected with the magnetic resonance apparatus or may be configured as part of the magnetic resonance apparatus. Control information for the computer program product may also be stored on an electronically readable data storage medium. The control information of the electronically readable data storage medium may be configured such that, when the data storage medium is used in a system control unit of a magnetic resonance apparatus, the control information performs a method according to the present embodiments. Examples of electronically readable data storage media are a DVD, a magnetic tape, or a USB stick on which electronically readable control information (e.g., software) is stored. If this control information is read from the data storage medium and stored in a system control unit of the magnetic resonance apparatus, all the embodiments of the previously described methods may be carried out. The present embodiments may accordingly also be based on the computer-readable medium and/or the electronically readable data storage medium.

BRIEF DESCRIPTION OF THE DRAWINGS

Mutually corresponding parts are provided with the same reference characters in all the figures.

FIG. 1 is a schematic representation of one embodiment of a magnetic resonance apparatus;

FIG. 2 is a diagram of one embodiment of a method for capturing MR data using the magnetic resonance apparatus;

FIG. 3 shows a diagram of exemplary recurrent subportions of the method;

DETAILED DESCRIPTION

Figure 4:
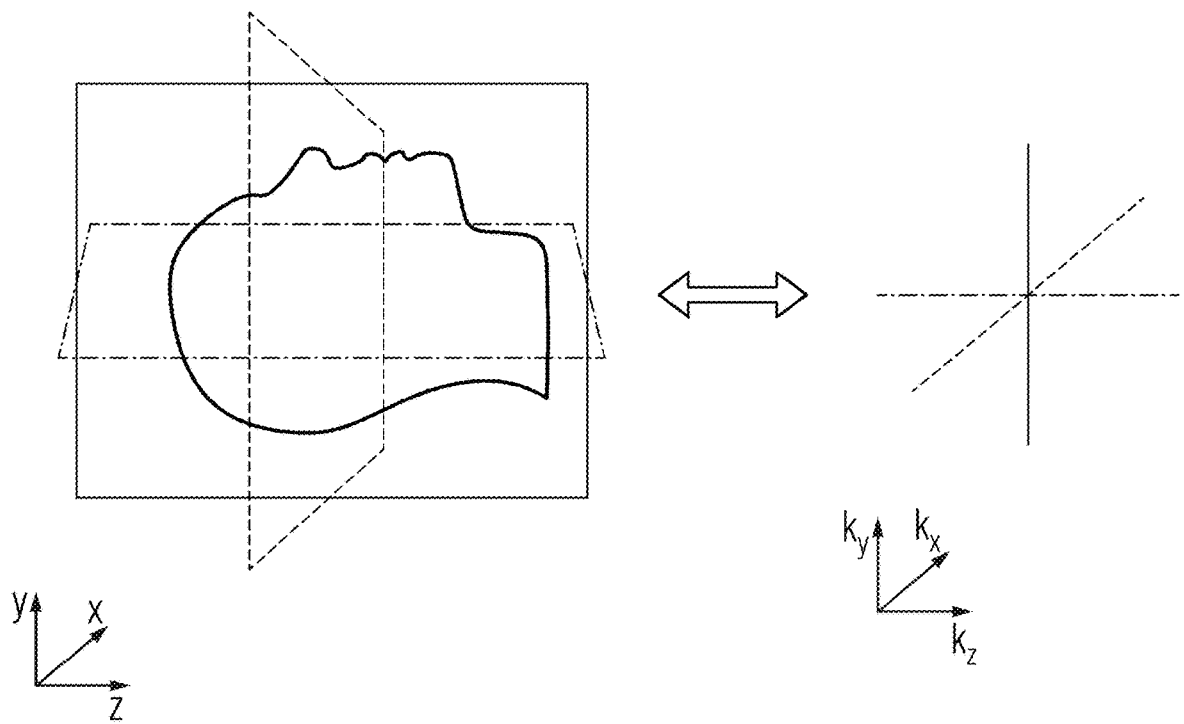
FIG. 4 shows an example of slice orientation and captured k-space lines of a 3-shot navigator.

FIG. 1 is a schematic representation of one embodiment of a magnetic resonance apparatus 10. The magnetic resonance apparatus 10 includes a magnet unit 11 that includes a main magnet 12 for generating a strong and, for example, time-constant main magnetic field 13. The magnetic resonance apparatus 10 also includes a patient receiving region 14 for receiving a patient 15. In the present exemplary embodiment, the patient receiving region 14 is of cylindrical construction and is cylindrically surrounded in a circumferential direction by the magnet unit 11. In principle, however, the patient receiving region 14 may at any time be formed in a manner that differs therefrom. The patient 15 may be advanced into the patient receiving region 14 by a patient positioning apparatus 16 of the magnetic resonance apparatus 10. The patient positioning apparatus 16 includes a patient table 17 that is movable within the patient receiving region 14.

The magnet unit 11 further includes a gradient coil unit 18 for generating magnetic field gradients that are used for spatial encoding during capture of MR data. The gradient coil unit 18 is controlled by a gradient control unit 19 of the magnetic resonance apparatus 10. The magnet unit 11 further includes a radiofrequency antenna unit 20 that is configured in the present exemplary embodiment as a body coil permanently integrated into the magnetic resonance apparatus 10. The radiofrequency antenna unit 20 is controlled by a radiofrequency antenna control unit 21 of the magnetic resonance apparatus 10 and, as transmit coil, irradiates excitation pulses (e.g., radiofrequency excitation pulses) in a patient receiving region 14 of the magnetic resonance apparatus 10. In this way, excitation of atomic nuclei is established in the main magnetic field 13 generated by the main magnet 12 in a generation region within the patient receiving region.

Figure 5:
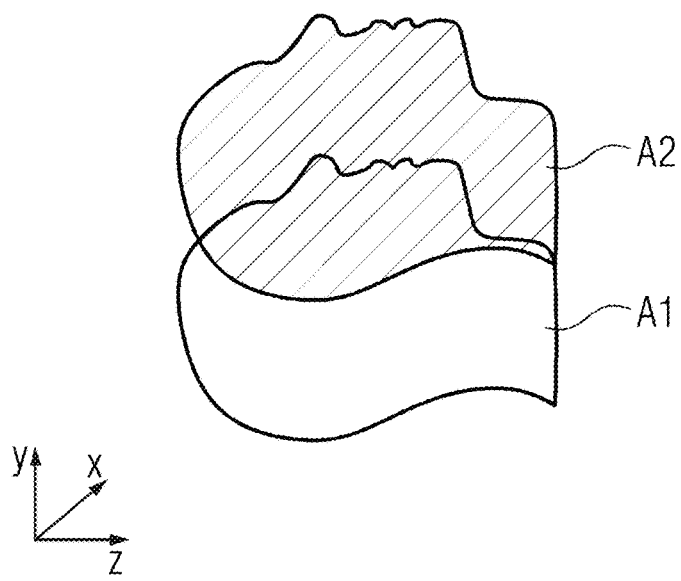
FIG. 5 shows an exemplary change in a generation region by translation in the y-direction.
Figure 6:
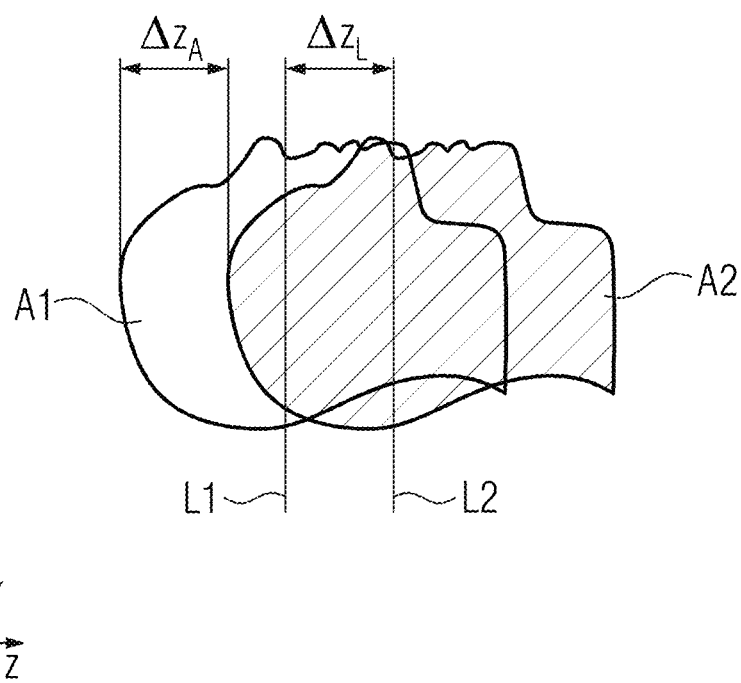
FIG. 6 shows an exemplary change in a generation region by translation in the z-direction.
Figure 7:
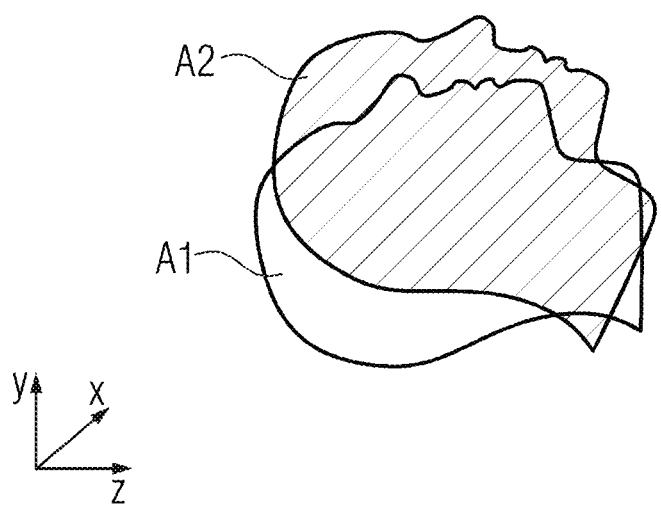
FIG. 7 shows an exemplary change in a generation region by rotation.

The generation region is thus the spatial region that contains atomic nuclei that may be excited by the excitation pulses by magnetic resonance (e.g., the region in which only air is located is not a generation region within the meaning of this description, since the excitation pulses for capturing medical MR data do not excite air molecules). FIGS. 5 to 7 show exemplary generation regions A1, A2 in the form of the head of the patient 15.

MR signals are generated by relaxation of the excited atomic nuclei. The magnetic resonance apparatus includes an MR local coil 26 that is mounted close to the patient 15. The MR local coil 26 is configured to receive the MR signals. The MR local coil 26 is therefore a receive coil. The MR local coil 26 may include a plurality of coil elements that, in each case, receive the MR signal with a specific sensitivity. A coil sensitivity of the MR local coil 26, for example, describes the sensitivities of the coil elements. The sensitivities of the coil elements are, for example, dependent on respective position relative to the generation region.

The radiofrequency antenna unit 20 may also be configured to receive the MR signals and therefore constitute a receive coil (e.g., the coil may be a transceive coil). It is thus also possible for the MR signals to be received with the same coil with which the excitation pulses are generated and irradiated.

The magnetic resonance apparatus 10 includes a system control unit 22 for controlling the main magnet 12 and the gradient control unit 19 and for controlling the radiofrequency antenna control unit 21. The system control unit 22 centrally controls the magnetic resonance apparatus 10, such as, for example, performance of a GRAPPA sequence. The received MR signals are transmitted as MR data from the radiofrequency antenna unit 20 as receive coil to the system control unit. Depending on the function of the MR data (e.g., in the case of subsequent reconstruction), the MR data may, for example, be MR reference data or MR imaging data. The system control unit 22 includes a reconstruction unit, not shown in greater detail, for reconstruction of the MR data acquired during the magnetic resonance examination. The magnetic resonance apparatus further includes an external sensor 27 connected with the system control unit 22 and configured to detect movement of the patient 15.

The magnetic resonance apparatus 10 also includes a user interface 23 that is connected to the system control unit 22. Control information, such as, for example, imaging parameters, and reconstructed MR images may be displayed on a display unit 24 (e.g., on at least one monitor) of the user interface 23 for a medical operator. The user interface 23 also includes an input unit 25, by which information and/or parameters may be input by the medical operator during a measurement procedure.

FIG. 2 shows one embodiment of a method for capturing MR data using a magnetic resonance apparatus 10. In S1, first MR reference data is captured. In S2, first MR imaging data is captured. Once the first MR imaging data has been captured, further MR imaging data is captured in S3.

Capture of the MR data, which proceeds respectively in S1, S2 and S3, is illustrated more precisely with reference to FIG. 3. In S0.1, at least one excitation pulse is generated with a transmit coil of the magnetic resonance apparatus 10 (e.g., the radiofrequency antenna unit 20) and irradiated into the patient receiving region 14 of the magnetic resonance apparatus 10.

In S0.2, MR signals are generated in a generation region within the patient receiving region 14 by the at least one excitation pulse. In S0.3, MR signals are received as MR data with a receive coil (e.g., the MR local coil 26).

In addition, according to FIG. 2, in S4, a degree of difference that describes a difference between the generation region on capture of the first MR reference data and the generation region on capture of the further MR imaging data is determined.

FIGS. 5 to 7 respectively show a generation region A1 on capture of the first MR reference data and a generation region A2 on capture of the further MR imaging data. A change in the generation regions A1, A2 may be brought about, for example, by translation (see FIGS. 5 and 6) and/or rotation (see FIG. 7).

In S5, further MR reference data is provided as a function of the reference dimension.

In S6, at least one MR image is reconstructed based on the captured further MR imaging data and the provided further MR reference data.

Various possibilities are illustrated below as to how, in S4, a degree of difference that describes a difference between the generation region on capture of the first MR reference data and the generation region on capture of the further MR imaging data is determined.

For example, S4 may include capture of first location data of the generation region on capture of the first MR reference data, and capture of further location data of the generation region on capture of the further MR imaging data, where the degree of difference is determined based on the first location data and the further location data.

Capture of the location data or determination of the generation regions may proceed, for example, based on MR data. Capture of the first location data and/or of the further location data, for example, includes the capture of MR navigator data using the magnetic resonance apparatus 10.

Thus, for example, a rapid 3-shot navigator may be provided in the context of sequence adjustments. In this case, a projection of the patient 15 in three spatial directions x, y and z may be acquired by three captures of the k-space center in in each case three spatial directions. This is shown in FIG. 4, which shows various slice orientations perpendicular to the x axis, y axis, and z axis and captured k-space-lines $k_x$, $k_y$, $k_z$ of a 3-shot navigator.

Such MR navigator data may be captured both after capture of the first MR reference data reference scan and before every subsequent data capture. By comparing the intensity profiles (e.g., through a histogram comparison or a mutual information method), it is possible to detect a change in the generation regions (e.g., of the position of the patient 15).

A determination of the degree of difference in S4 may also proceed without the assistance of MR data. For example, location data may be captured based on external sensors 27 such as, for example, cameras, radar, or detectors, which are based on RF reflection (e.g., the respiratory sensor), as well as pilot tone sensors. Capture of the first location data and/or of the further location data may thus include the capture of optical signals, radar signals, and/or reflected RF signals and/or pilot tone signals.

A further possibility for determining the degree of difference (e.g., for deciding whether new MR reference data is needed) involves reconstructing MR imaging data initially with the previous MR reference data and then analyzing the image content. A neural network (e.g., a deep learning method), for example, may be used for image quality assessment, or a comparison may be performed with image content from previously recorded measurements or data sets of MR reference data. If there are significant differences, new MR reference data may be captured with subsequent re-reconstruction.

Various possibilities are described below as to how in S5 the further MR reference data is provided as a function of the reference dimension. This may, for example, include capture of new MR reference data and provision of new MR reference data as the further MR reference data or modification of the first MR reference data and provision of the modified MR reference data as the further MR reference data or provision of the first MR reference data as the further MR reference data.

It is verified, for example, whether the degree of difference exceeds a specified threshold value; in the affirmative, new MR reference data is captured, and the new MR reference data is provided as the further MR reference data.

If, for example, too strong a movement of the patient 15 takes place (e.g., translation and rotation beyond a threshold value, such as 1 cm or 20°) or the image content changes in some other way (e.g., by modification of the position of an arm of the patient 15), the reference data may be recaptured, and this new MR reference data may be provided as further MR reference data. The data provided as further MR reference data may, for example, be used for measurements that have just taken place and/or for future measurements.

FIG. 5 shows an instance according to which the generation region A1 develops, on capture of the first MR reference data, through translation in the y-direction into the generation region A2 on capture of the further MR imaging data. This may proceed, for example, by the patient 15 moving her head upwards. In this example, the y-direction corresponds to phase-encoding direction (e.g., corresponding to the $k_y$-direction in the k-space), the x-direction corresponds to the read-out direction (e.g., corresponding to the $k_x$-direction in the k-space), and the z-direction corresponds to the frequency encoding direction (e.g., corresponding to the $k_z$-direction in the k-space).

Translation in the image space according to the Fourier shift theorem generates a linear phase ramp in the k-space. In S5, a linear phase ramp in the respective k-space-direction may be multiplied onto the first MR reference data, which is provided as further MR reference data.

FIG. 6 shows an instance according to which the generation region A1 develops, on capture of the first MR reference data, through translation in the z-direction into the generation region A2 on capture of the further MR imaging data. The z-direction is, for example, also the slice direction (e.g., slices L1 and L2 to be captured are displaced in the z-direction). If translation takes place along the slice direction, the calibrated GRAPPA kernel may be reassigned to another slice depending on the scope of the captured MR reference data.

In the example shown, the length of the translation $\alpha z_A$ corresponds to the spacing of the slices $\Delta z_L$, such that the part of the first MR reference data that was initially to be assigned to the slice L2 may then, in S5, be provided as further MR reference data for the slice L1. If capture of the MR data thus includes the capture of a plurality of slices along a slice direction, a part of the first MR reference data may be assigned to at least a part of the plurality of slices L1, L2.

If the endpoint of the translation lies between two slices, the respective slice kernel may be interpolated to yield a new kernel. The edge slices optionally are to be recalibrated.

FIG. 7 shows an instance according to which the generation region A1 develops, on capture of the first MR reference data, through rotation into the generation region A2 on capture of the further MR imaging data. If rotation takes place, recalibration may be performed by interpolation of reference lines into the already captured MR reference data. For example, new rotated reference lines (e.g., a new data area) may be obtained by interpolation from the previously captured MR reference data.

If the time of a major change in the generation region (e.g., caused by movement of the patient 15) is known (e.g., by movement detection by external sensors), the part of the MR imaging data prior to the change in generation region may proceed using previous MR reference data, and the part of the MR imaging data after the change using newly captured MR reference data. In the case of continuous changes to the generation region (e.g., by continuous movement of the patient 15), averaging, adapted to the degree of change, of different data sets of MR reference data or the GRAPPA kernel calculated therefrom may also be provided.

The method described above in detail and the depicted magnetic resonance apparatus are merely exemplary embodiments that may be modified in the most varied manner by a person skilled in the art without departing from the scope of the invention. Further, use of the indefinite article "a" does not rule out the possibility of a plurality of the features in question also being present. Likewise, the term "unit" does not rule out the possibility of the components in question consisting of a plurality of interacting subcomponents that may optionally also be spatially distributed.

The elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent. Such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A method for capturing magnetic resonance (MR) data using a magnetic resonance apparatus, the method comprising:
　　capturing, by the magnetic resonance apparatus, first MR reference data;
　　capturing, by the magnetic resonance apparatus, first MR imaging data;
　　capturing, by the magnetic resonance apparatus, further MR imaging data after capturing the first MR imaging data, wherein capturing each of the first MR reference data, the first MR imaging data, and the further MR imaging data comprises generating at least one excitation pulse with a transmit coil of the magnetic resonance apparatus and irradiating the at least one excitation pulse into a patient receiving region of the magnetic resonance apparatus, generating MR signals in a generation region within the patient receiving region using the at least one excitation pulse, and receiving the MR signals as MR data with the receive coil of the magnetic resonance apparatus, the first MR reference data, the first MR imaging data, the further MR imaging data, or any combination thereof being captured using a parallel imaging technique;

determining, by a processor, a degree of difference that describes a difference between the generation region on capture of the first MR reference data and the generation region on capture of the further MR imaging data;

providing, by the processor, further MR reference data as a function of the degree of difference, the providing of the further MR reference data as a function of the degree of difference comprising:

verifying whether the degree of difference exceeds a specified threshold value; and when the verifying is in the affirmative, capturing new MR reference data and providing the new MR reference data as the further MR reference data;

reconstructing, by the processor, at least one MR image based on the captured further MR imaging data and the provided further MR reference data; and storing or displaying, by the processor, the reconstructed at least one MR image.

2. A magnetic resonance (MR) apparatus configured to capture first MR reference data, capture first MR imaging data, and capture further MR imaging data after the capture of the first MR imaging data, the first MR reference data, the first MR imaging data, the further MR imaging data, or any combination thereof being captured using a parallel imaging technique, the MR apparatus comprising:

a transmit coil configured, for the capture of each of the first MR reference data, the first MR imaging data, and the further MR imaging data, to:
generate at least one excitation pulse; and
irradiate the at least one excitation pulse into a patient receiving region of the magnetic resonance apparatus, MR signals being generated in a generation region within the patient receiving region using the at least one excitation pulse;

a receive coil configured to receive the MR signals as MR data; and a processor configured to:
determine a degree of difference that describes a difference between the generation region on capture of the first MR reference data and the generation region on capture of the further MR imaging data;
provide further MR reference data as a function of the degree of difference, the processor being configured to provide the further MR reference data as a function of the degree of difference comprising the processor being configured to:
verify whether the degree of difference exceeds a specified threshold value; and
capture new MR reference data and provide the new MR reference data as the further MR reference data when the verification is in the affirmative;
reconstruct at least one MR image based on the captured further MR imaging data and the provided further MR reference data; and
store or display the reconstructed at least one MR image.

3. In a non-transitory computer-readable storage medium that stores instructions executable by one or more processors to capture magnetic resonance (MR) data using a magnetic resonance apparatus, the instructions comprising:

capturing, by the magnetic resonance apparatus, first MR reference data;

capturing, by the magnetic resonance apparatus, first MR imaging data;

capturing, by the magnetic resonance apparatus, further MR imaging data after capturing the first MR imaging data, wherein capturing each of the first MR reference data, the first MR imaging data, and the further MR imaging data comprises generating at least one excitation pulse with a transmit coil of the magnetic resonance apparatus and irradiating the at least one excitation pulse into a patient receiving region of the magnetic resonance apparatus, generating MR signals in a generation region within the patient receiving region using the at least one excitation pulse, and receiving the MR signals as MR data with a receive coil of the magnetic resonance apparatus, the first MR reference data, the first MR imaging data, the further MR imaging data, or any combination thereof being captured using a parallel imaging technique;

determining, by a processor, a degree of difference that describes a difference between the generation region on capture of the first MR reference data and the generation region on capture of the further MR imaging data;

providing, by the processor, further MR reference data as a function of the degree of difference, the providing of the further MR reference data as a function of the degree of difference comprising:

verifying whether the degree of difference exceeds a specified threshold value; and when the verifying is in the affirmative, capturing new MR reference data and providing the new MR reference data as the further MR reference data;

reconstructing, by the processor, at least one MR image based on the captured further MR imaging data and the provided further MR reference data; and storing or displaying, by the processor, the reconstructed at least one MR image.

4. The method as claimed in claim 1, further comprising:
modifying the first MR reference data and providing the modified MR reference data as the further MR reference data; or
providing the first MR reference data as the further MR reference data.

5. The method of claim 1, further comprising:
capturing first location data of the generation region on capture of the first MR reference data; and
capturing further location data of the generation region on capture of the further MR imaging data,
wherein determining the degree of difference comprises determining the degree of difference based on the first location data and the further location data.

6. The method of claim 1, wherein reconstructing the at least one MR image comprises reconstructing an MR image based on the first MR reference data and the further MR imaging data, and
wherein the degree of difference is determined based on the reconstructed MR image.

7. The method of claim 1, wherein capturing the first MR reference data comprises capturing a GRAPPA kernel.

8. The method of claim 1, further comprising:
verifying whether the difference between the generation region on capture of the first MR reference data and the generation region on capture of the further MR imaging data is caused wholly or in part by translation of the generation regions in a plane defined by a read-out direction and a phase-encoding direction; and
when the verifying is in the affirmative, multiplying a linear phase ramp in the respective k-space-direction onto the first MR reference data, which is provided as the further MR reference data.

9. The method of claim 1, wherein capturing the respective MR data comprises capturing a plurality of slices along a slice direction, and wherein a part of the first MR reference data is assigned to at least a part of the plurality of slices.

10. The method of claim 1, wherein the provided further MR reference data is adopted as the first MR reference data for MR imaging data, which is captured after the further MR imaging data.

11. The method of claim 1, further comprising:
detecting a change in the generation region during the capturing of the first MR imaging data;
capturing new MR reference data and providing the new MR reference data as the further MR reference data,
determining a point in time at which the change in the generation region exceeds a specified limit value; and
assigning different MR reference data to a part of the first MR imaging data captured before the point in time than to a part of the first MR imaging data captured after the point in time.

12. The method of claim 1, wherein the parallel imaging technique is a GeneRealized Autocalibrating Partial Parallel Acquisition (GRAPPA) imaging technique, a Sensitivity Encoding (SENSE) imaging technique, or a slice-GRAPPA technique.

13. The method of claim 5, wherein capturing the first location data, capturing the further location data, or capturing the first location data and capturing the further location data comprise capturing MR data using the magnetic resonance apparatus.

14. The method of claim 5, wherein capturing the first location data, capturing the further location data, or capturing the first location data and capturing the further location data comprise capturing MR navigator data using the magnetic resonance apparatus, the MR navigator data being captured using a three-shot navigator sequence.

15. The method of claim 5, wherein capturing the first location data, capturing the further location data, or capturing the first location data and capturing the further location data comprise capturing optical signals, radar signals, reflected RF signals, pilot tone signals, or any combination thereof.

16. The method of claim 5, wherein determining the degree of difference comprises determining the degree of difference based on a histogram comparison of the first location data and the further location data, mutual information of the first location data and the further location data, or a combination thereof.

17. The method of claim 6, wherein determining the degree of difference comprises analyzing the reconstructed MR image with the assistance of a neural network.

18. The method of claim 6, wherein reconstructing the MR image comprises reconstructing the MR image based on the first reference data and the first MR imaging data, the MR image being compared with the MR image reconstructed based on the first reference data and the further MR imaging data.

19. The method of claim 9, further comprising:
verifying whether the difference between the generation region on capture of the first MR reference data and the generation region on capture of the further MR imaging data is caused wholly or in part by translation of the generation regions along the slice direction; and
when the verifying is in the affirmative, modifying, for at least one slice of the plurality of slices, the first MR reference data, and providing the modified MR reference data as the further MR reference data, the modifying of the first MR reference data comprising:
changing assignment of at least one part of the first MR reference data;
interpolating at least two parts of the MR reference data assigned to at least two different slices of the plurality of slices; or
a combination thereof.

20. The method of claim 9, further comprising:
verifying whether the difference between the generation region on capture of the first MR reference data and the generation region on capture of the further MR imaging data is caused wholly or in part by rotation of the generation regions; and
when the verifying is in the affirmative, modifying, for at least one slice of the plurality of slices, the first MR reference data as a function of the rotation and providing the modified MR reference data as the further MR reference data, the modifying of the first MR reference data comprising interpolating the first MR reference data.

21. The method of claim 11, wherein when the detected change in the generation region is a continuous change in the generation region, the method further comprises:
assigning MR reference data adapted to a degree of the continuous change and averaged, interpolated from the first MR reference data, or averaged and interpolated from the first MR reference data; and
assigning the new MR reference data to the first MR imaging data.

22. The method of claim 12, wherein capturing the first MR reference data comprises capturing a GRAPPA kernel.

23. The method as claimed in claim 4, wherein the specified threshold value is a first threshold value,
wherein modifying the first MR reference data and providing the modified MR reference data as the further MR reference data comprises:
determining whether the degree of difference exceeds a second threshold value; and
modifying the first MR reference data and providing the modified MR reference data as the further MR reference data when, based on the determining of whether the degree of difference exceeds the second threshold value, the degree of difference exceeds the second threshold value, and
wherein providing the first MR reference data as the further MR reference data comprises:
determining whether the degree of difference is less than a third threshold value; and
providing the first MR reference data as the further MR reference data when, based on the determining of whether the degree of difference is less than the third threshold value, the degree of difference is less than the third threshold value.

* * * * *